United States Patent [19]

Hur et al.

[11] Patent Number: 5,437,947
[45] Date of Patent: Aug. 1, 1995

[54] PHASE SHIFTING MASK AND METHOD OF MANUFACTURING THE SAME

[75] Inventors: Hun Hur; Jun S. Lee, both of Seoul, Rep. of Korea

[73] Assignee: Goldstar Electron Co., Ltd.

[21] Appl. No.: 221,386

[22] Filed: Mar. 31, 1994

[30] Foreign Application Priority Data

Mar. 4, 1994 [KR] Rep. of Korea ............... 4218/1994

[51] Int. Cl.$^6$ .............................................. G03F 9/00
[52] U.S. Cl. ...................................... 430/5; 430/322; 430/323; 430/324
[58] Field of Search ................ 430/5, 322, 323, 324

[56] References Cited

U.S. PATENT DOCUMENTS

| | | | |
|---|---|---|---|
| 3,604,778 | 9/1971 | Burckhardt | 350/3.5 |
| 4,068,260 | 1/1978 | Ohneda et al. | 358/44 |
| 4,360,586 | 11/1982 | Flanders et al. | 430/321 |
| 4,774,164 | 9/1988 | Peavey et al. | 430/296 |
| 4,782,035 | 11/1988 | Fujiwara | 437/129 |
| 4,985,319 | 1/1991 | Watakabe et al. | 430/5 |
| 5,153,083 | 10/1992 | Garofalo et al. | 430/5 |
| 5,187,726 | 2/1993 | White | 378/35 |
| 5,246,799 | 9/1993 | Pierrat | 430/5 |
| 5,300,379 | 4/1994 | Dao et al. | 430/5 |

OTHER PUBLICATIONS

Paper Entitled "Fabrication of 64M DRAM with I--Line Phase-Shift Lithography" by K. Nakagawa, et al. Published in the Technical Digest of the International Electron Devices Society of IEEE Dec. 9-12, 1990.
Paper Entitled "Spatial Filtering for Depth of Focus and Resolution Enhancement in Optical Lithography" by H. Fukuda, et al., Published in *J. Vac. Sci. Technol.* Nov./Dec. 1991.

*Primary Examiner*—S. Rosasco
*Attorney, Agent, or Firm*—Poms, Smith, Lande & Rose

[57] ABSTRACT

An edge enhancement phase shifting mask having a recessed opaque layer which optimally exhibits the phase shifting effect at edge portion is disclosed, wherein the mask comprises a transparent substrate having at least one or more trenches spaced apart from each other by a predetermined distance, an opaque layer filling some portion of the trench, and a phase shifting layer formed on the substrate area between the trenches. And the method of manufacturing such a mask comprises the steps of forming a first photoresist pattern by etching the coated photoresist film on a transparent substrate, forming at least one or more trenches by etching the transparent substrate masked with the patterned photoresist layer, forming a opaque layer occupying some portion of the trench through etch back process applying to a deposited metal layer on the whole surface of the substrate, forming a phase shifting layer over the surface of the non-etched transparent substrate and exposing a substrate area between the phase shifting layer and the opaque layer.

28 Claims, 23 Drawing Sheets

PHASE SHIFTING MASK AND METHOD OF MANUFACTURING THE SAME

BACKGROUND OF THE INVENTION

This invention relates to the photolithography, more particularly, to a phase shifting mask for improving the resolution and the method of manufacturing the same.

According to the recent trend toward the high integration and denser package of semiconductor devices, it is required to transfer the fine line patterns delineated in the photomask to the wafer as is desired, so there have been proposed the particularly modified manufacturing techniques.

Generally, the photolithography is the technique that enables to transfer the delineated image pattern in the mask to the photoresist film on a substrate, the light such as ultraviolet being incident upon the photoresist film through the mask.

The general photomask has the delineated features of transparent and opaque portions, which makes it possible to be selectively exposed. However, the resolution is no longer improved by the diffraction resulting from the increased pattern densities.

There have been widely studied various techniques for improving the photolithography resolution by employing the phase shift lithography technique.

A phase shifting lithography uses the transparent portion comprising a general transparent portions and another transparent portions with 180 degrees phase shifting which is made of a phase shifting material. Thus it is possible to solve the diffraction as well by the interference between the transparent portions at the opaque portion.

Accordingly there are developed various lithography techniques, for example, the sharp modulation of the light intensity, which makes it possible to approximate the delineated features to the image patterns in the mask, and the transfer of very complicated patterns as well.

There are provided a Levenson type mask and an edge enhancement type mask, the former has a transparent optical phase shifting layer formed in either transparent portion or other transparent portion adjacent to that portion and, the latter shifts the phase of the light at ends of the different 2 transparent portions to reduce the light intensity after the propagation of the light through the mask.

In the fabricating of the edge enhancement type mask, a pattern part of phase shifting material is prepared such that the pattern part has the width larger than that of the light shielding layer underneath the pattern part and then both side walls of the light shielding layer are selectively etched away with the pattern part served as an etch mask. Therefore the effect of the phase shifting layer is exhibited depending upon the width of the light shielding layer.

FIGS. 1A through 3C are sectional views explaining the process steps of a phase shift mask according to conventional art.

On a transparent lower substrate 11 is formed an opaque light shielding layer 12 on which a phase shifting layer 13 is disposed (FIG. 1A).

With a photoresist layer 14 as a mask, the stacks of the phase shifting layer and light shielding layer is etched away to expose the surface of the transparent lower substrate 11 (FIG. 1B).

After removing the photoresist layer 14, an isotropic etching or wet etching is carried out to remove the end portions of the light shielding layer 12 masked by the phase shifting layer thereon so that the pattern width can be adjusted, thereby the required mask is manufactured (FIG. 1C).

FIG. 2 illustrates the light intensity distribution associated with the conventional phase shifting mask.

As seen from FIG. 2A showing the light intensity in wafer which is subjected to the optical radiation, an accurate phase shifting is not introduced in the end portions of the conventional phase shifting mask used, which results in the photoresist pattern 16 on the wafer 15 as shown in FIG. 2B.

This is because the wet etching produces the under cut configuration of the peripheral portions of the shielding layer which affects the accurate phase shifting effect.

Furthermore, when the phase shifting layer and light shielding layer is made to form their patterns, it can be shown the reverse critical dimension structure which makes it difficult the correction of the unexpectedly defected mask.

Further, there exists an instability of the side surface due to the uniformity of the surface level.

SUMMARY OF THE INVENTION

It is an object to provide the phase shifting mask which facilitates an adjustment of the line width and thickness of the phase shifting layer by forming the light shielding layer inside the trench to improve the phase shifting effect, and to provide the method of manufacturing such a mask.

The phase shifting mask of this invention comprises a transparent substrate having at least one or more trenches spaced apart from each other by a predetermined distance, an opaque layer filling some portion of the trench, and a phase shifting layer formed on the substrate area between the trenches.

And, the method of manufacturing such a mask comprises the steps of forming a first photoresist pattern by etching the coated photoresist film on a transparent substrate, forming at least one or more trenches by etching the transparent substrate masked with the patterned photoresist layer, forming a opaque layer occupying some portion of the trench through etch back process applying to a deposited metal layer on the whole surface of the substrate, and forming a phase shifting layer over the surface of the non-etched transparent substrate and exposing a substrate area between the phase shifting layer and the opaque layer.

DETAILED DESCRIPTION OF THE INVENTION

FIGS. 3A through 3G are sectional views explaining the process steps of a phase shift mask according to a preferred first embodiment of this invention.

Figure 1A:
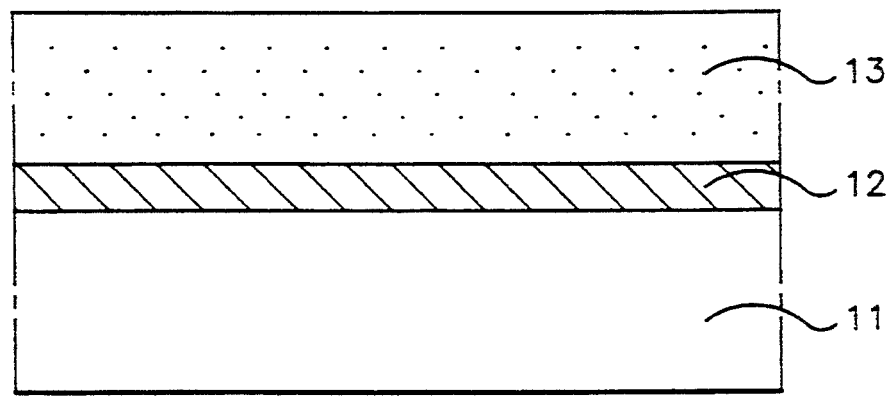
FIG. 1A to 1C are sectional views explaining the process steps of a conventional phase shift mask, FIG. 2A to 2B graphically show the light intensity distribution of FIG. 1.
Figure 1B:
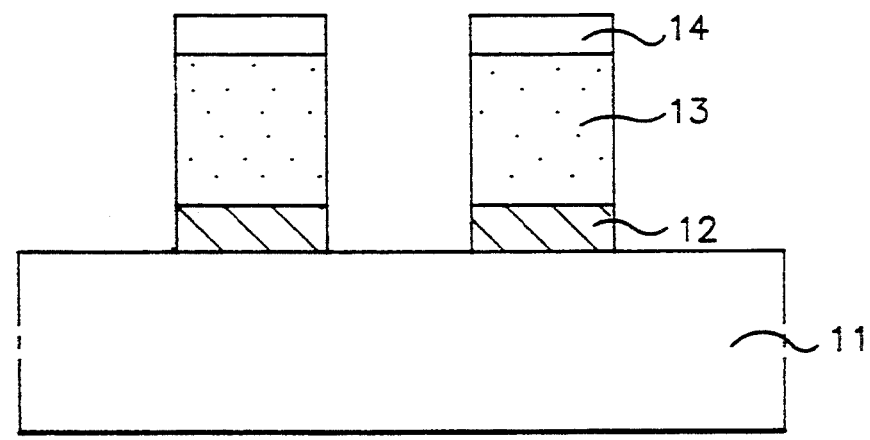
Figure 1C:
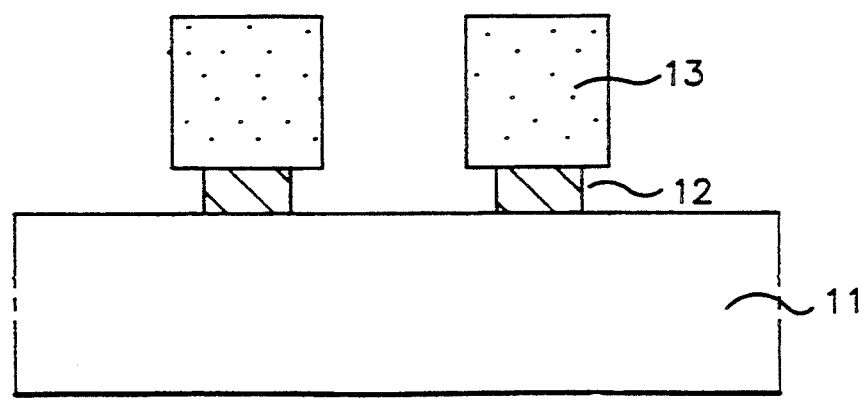
Figure 2A:
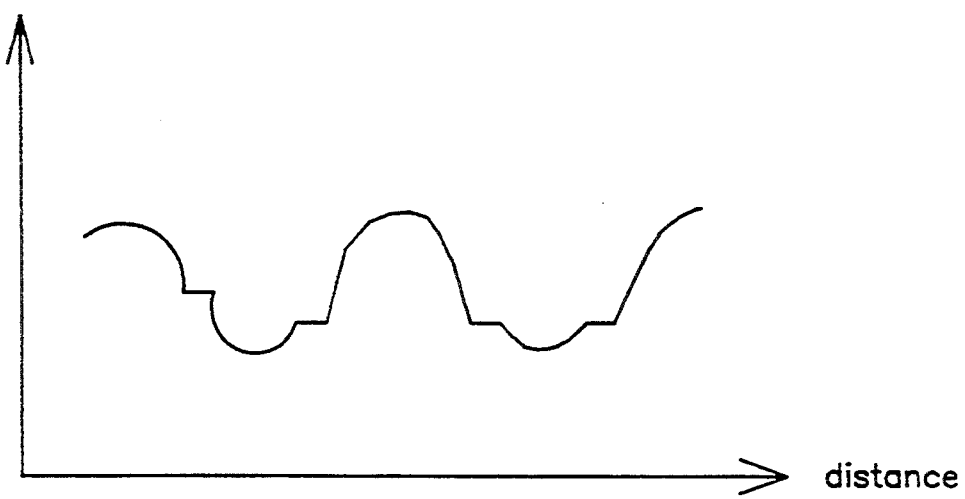
Figure 2B:
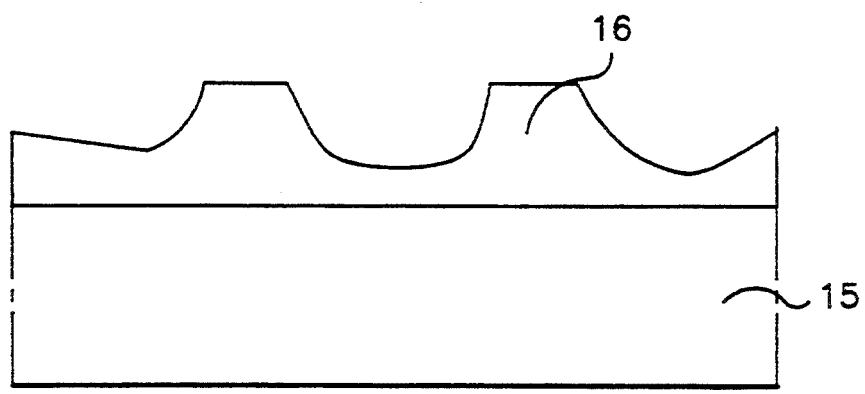
Figure 3A:
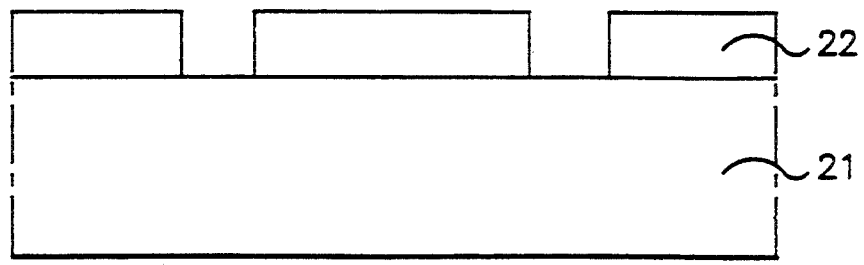
FIG. 3A to 3G are sectional views explaining the process steps of a phase shift mask according to first embodiment of this invention.

Referring to FIG. 3A, coated on the transparent substrate 21 is a layer of photoresist material 22 and then it is formed a photoresist pattern of the width W through the photolithographic process.

Figure 3B:
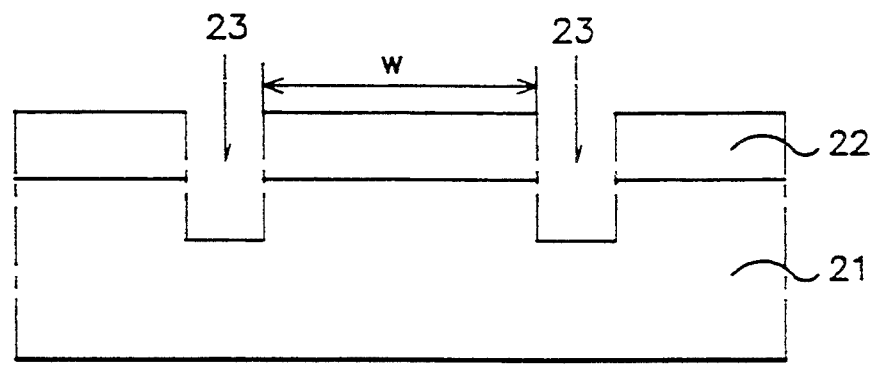

With the patterned photoresist layer 22 as a mask, the revealed substrate 21 is etched away to form a trench 23 as shown in FIG. 3B.

Figure 3C:
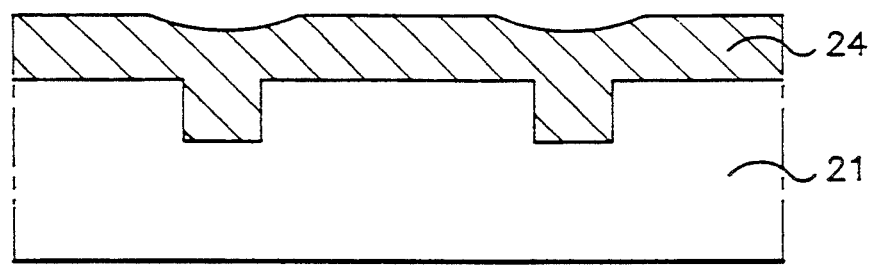

Upon removal of the photoresist layer 22, a layer of chrome 24 is deposited over the substrate 21 in such a manner that the trench 23 is fully filled with the chrome, as shown in FIG. 3C.

Figure 3D:
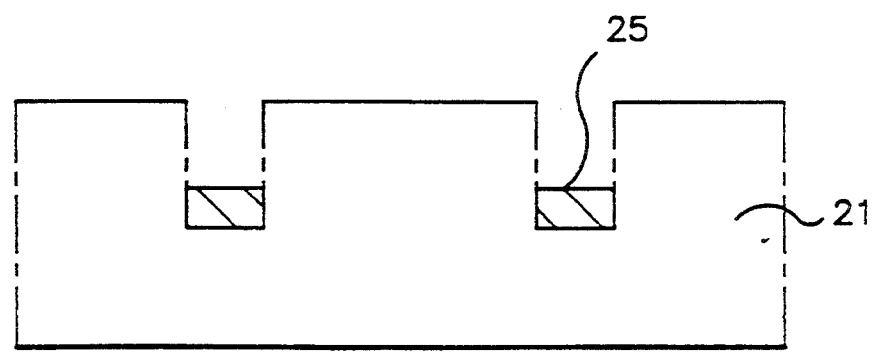
Figure 3E:
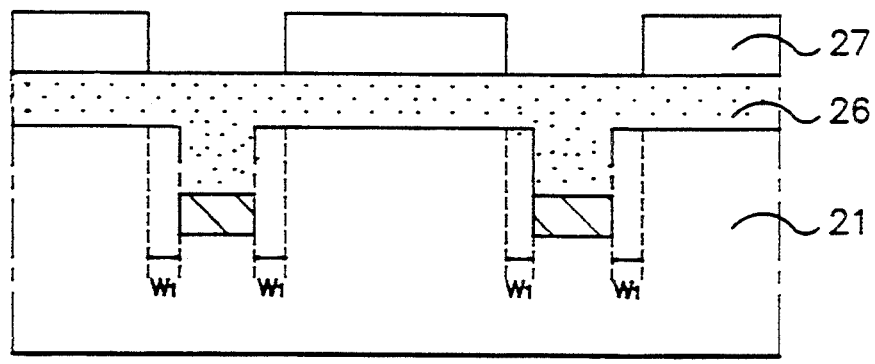
Figure 3F:
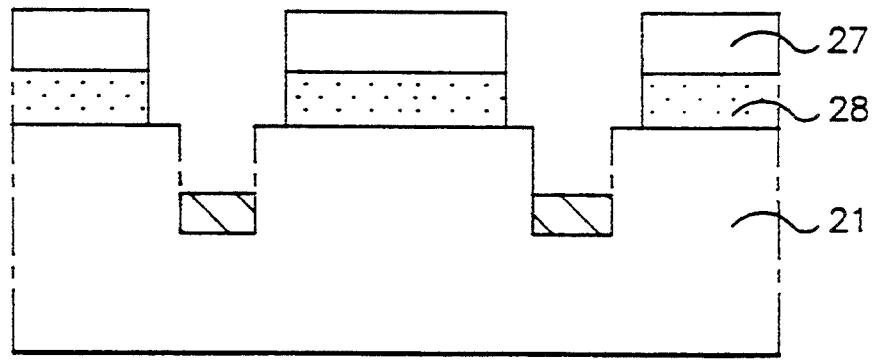

A layer of chrome 24 is etched back and then an opaque layer remains in the trench 23 (FIG. 3D).

Continuously, so as to fully fill the trench 23, there is formed a layer of oxide 26 with a layer of photoresist material 27 thereon. It is exposed the oxide layer 26 at the portion corresponding to the partially removed photoresist layer by patterning the photoresist layer 27 to form a photoresist pattern by the photolithography technique.

The formed photoresist pattern has the width smaller by width 2W1 of a factor than the pattern width of the photoresist layer 22 used for the trench formation.

Figure 3G:
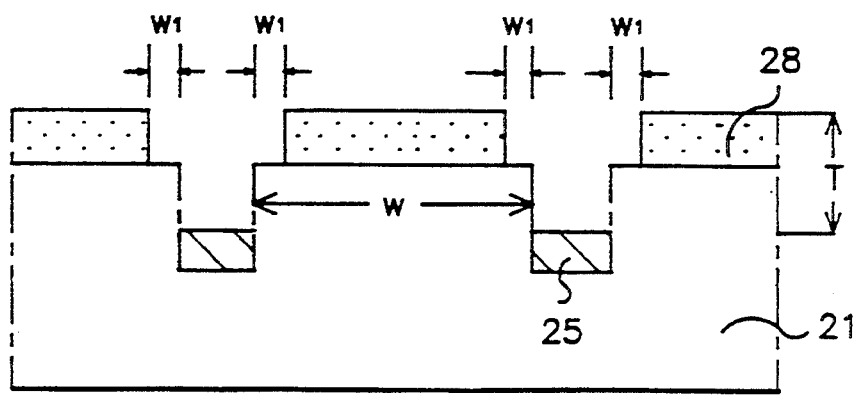

With the patterned photoresist layer 27 as a mask, the exposed oxide layer 26 is etched away to form a phase shift mask 28 over the substrate 23 which remains non-etched between the trenches, and then the photoresist layer is removed, as shown in FIG. 3G.

Therefore, it is obtained an edge enhancement phase shifting mask that the opaque layer 25 resides in the trench 23.

This invention facilitates an adjustment of the line width and thickness of the phase shifting layer 28 around the opaque layer 25 as the light shielding layer 25 by forming the opaque layer served as the light shielding layer 25 inside the trench 23 which is formed by etching the surface of the transparent substrate 21 to reduce the stepped portion of the transparent substrate 21.

It should be determined the thickness T of the phase shifting layer for shifting the phase by of a factor with respect to the passed light through the respective phase shifting layer and the optimal thickness is given from the following equation.

$$\pi = k(n - n0) * T$$
$$= (2\pi/\lambda)*(n - 1)T$$

therefore, $T = \lambda/[2(n-1)]$ where $\lambda$, $n0$, and $n$ denote wavelength of exposure light source, refraction index of an air($=1$), and the index of refraction associated with the material for phase shifting under the exposure wavelength, respectively.

The width of the phase shifting layer is equal to or less than that of the substrate area remaining non-etched between the phase shifting layer.

The phase difference is introduced at both edge portions of the aligned phase shifting layer on the transparent substrate 21.

Figure 4A:
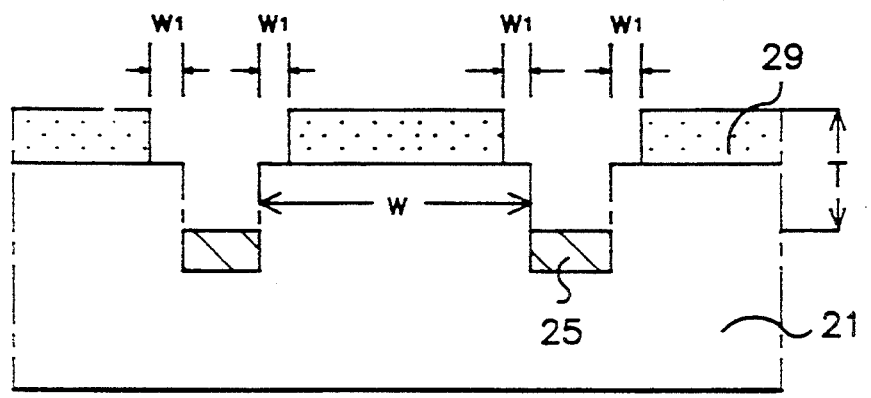
FIG. 4A to 4E graphically show the light intensity distribution of FIG. 3.
Figure 4B:
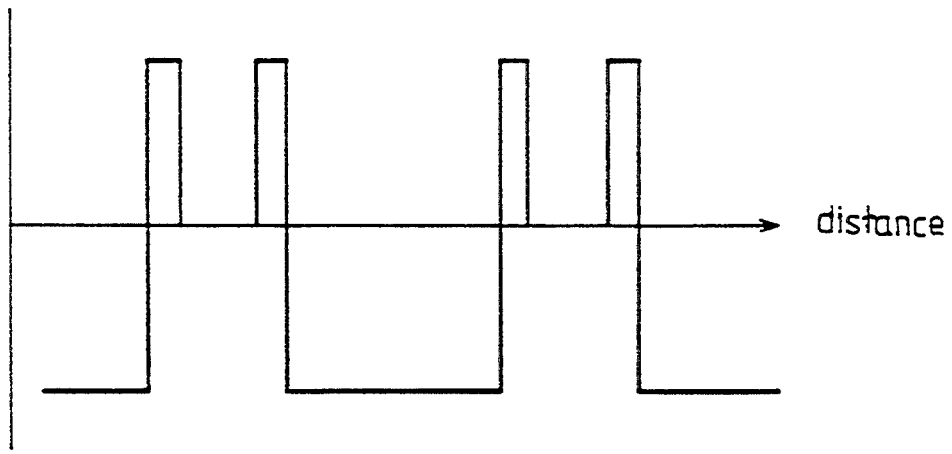
Figure 4C:
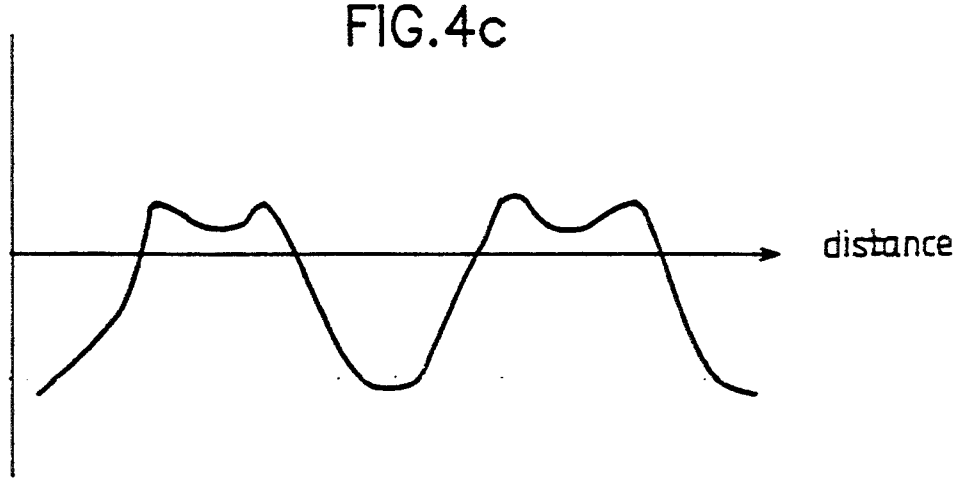
Figure 4D:
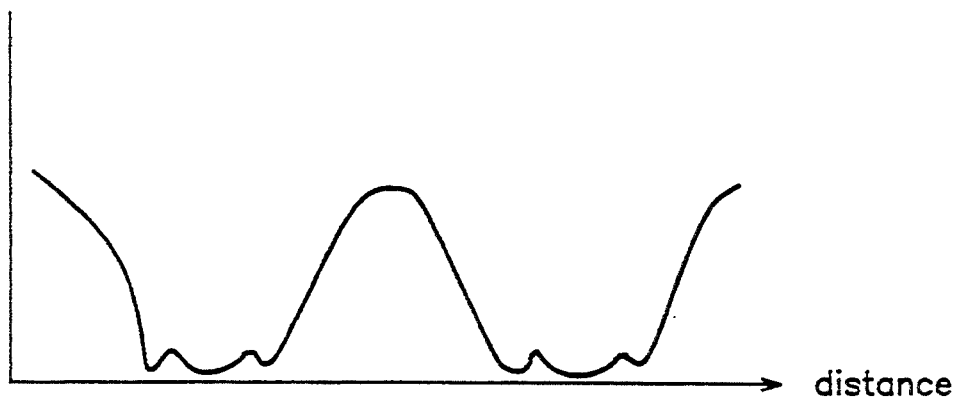

The opaque layer acting as the light shielding layer is made of chrome or alternatively aluminum, and the phase shifting layer 28 made of one of PMMA, SOG or quartz instead of oxide layer. In the case of the phase shifting mask of FIG. 4A, it is shown in FIG. 4B the phase of the passed light through that mask. As shown in FIG. 4B, the phase of the positive amplitude is shown when the light passes the edge portion of the phase shifting mask of the invention. The light amplitude and intensity on the wafer is plotted in FIG. 4C and 4D, respectively.

Figure 4E:
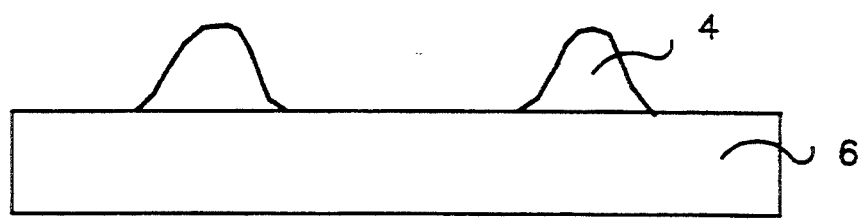

Therefore, since the phase shifting in edge portion is advantageously effected, the photoresist pattern with the improved resolution on the wafer 31 can be formed as shown in FIG. 4E.

Referring to FIGS. 5A to 5H, a phase shift mask is manufactured in accordance with another embodiment of the invention.

Figure 5A:
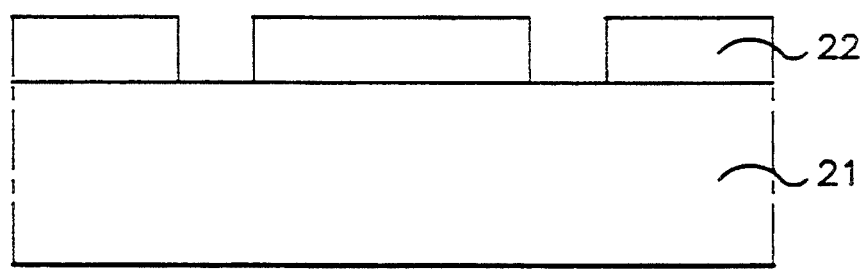
FIG. 5A to 5H are sectional views showing the process steps of a phase shift mask in accordance with second embodiment of this invention.
Figure 5B:
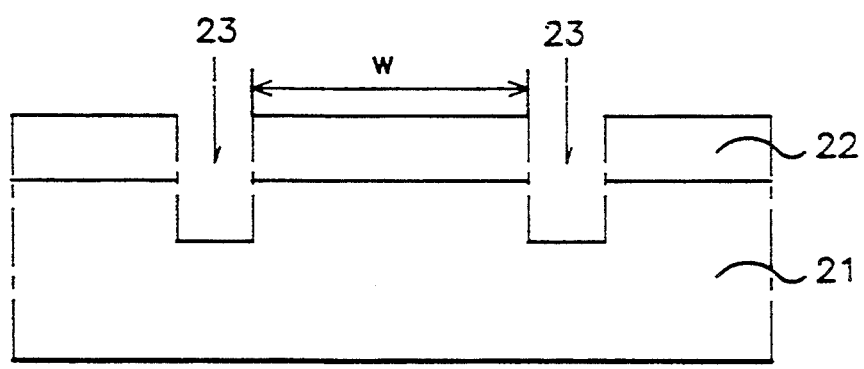
Figure 5C:
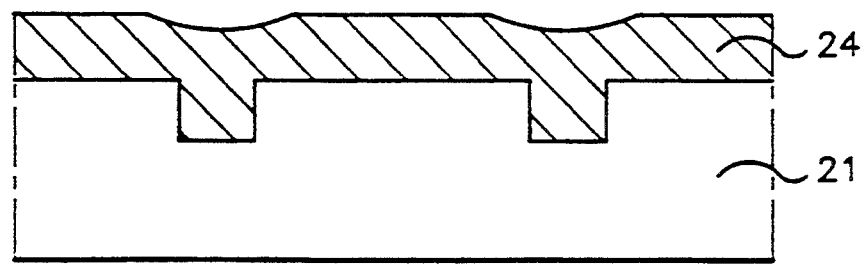
Figure 5D:
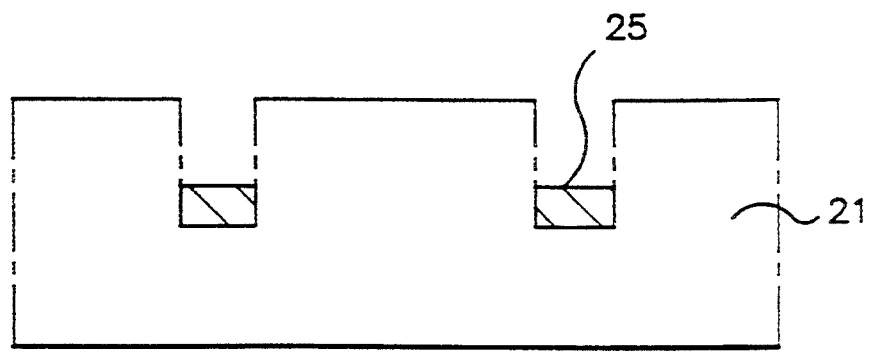
Figure 5E:
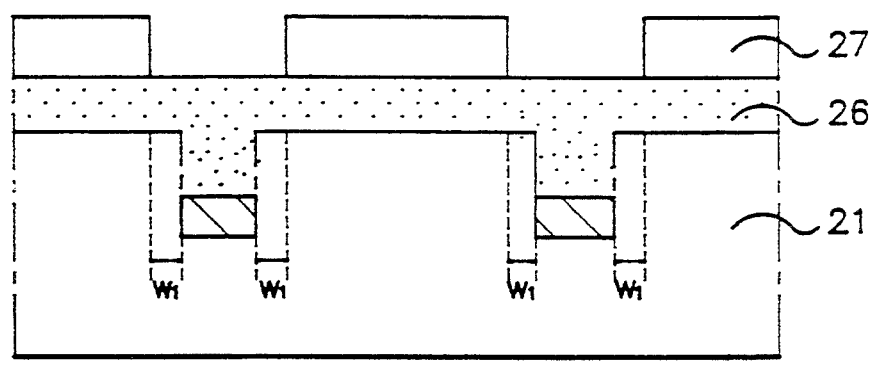
Figure 5F:
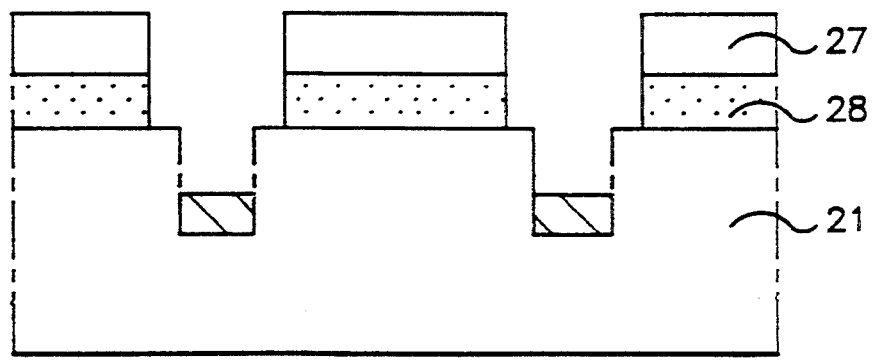
Figure 5G:
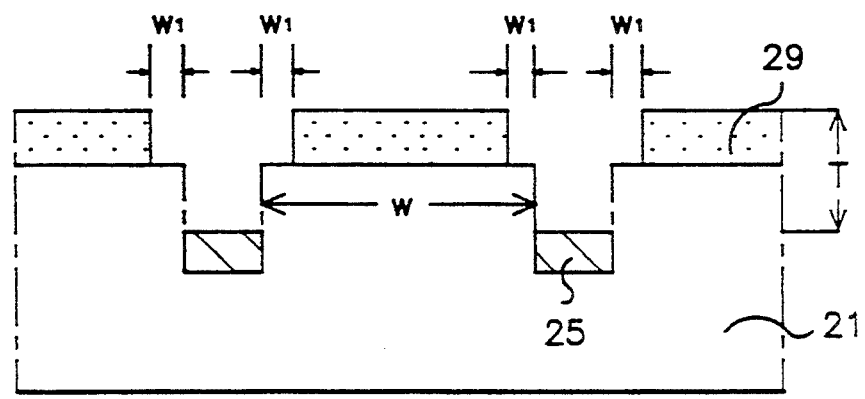

This mask can be manufactured in the same way as the mask of the afore-described first embodiment except that after the phase shifting layer 28 of FIG. 5G is formed, the step is further comprised which the quartz substrate 21 underneath the phase shifting layer 28 is etched to the width W1 from both sides of that substrate 21.

Figure 5H:
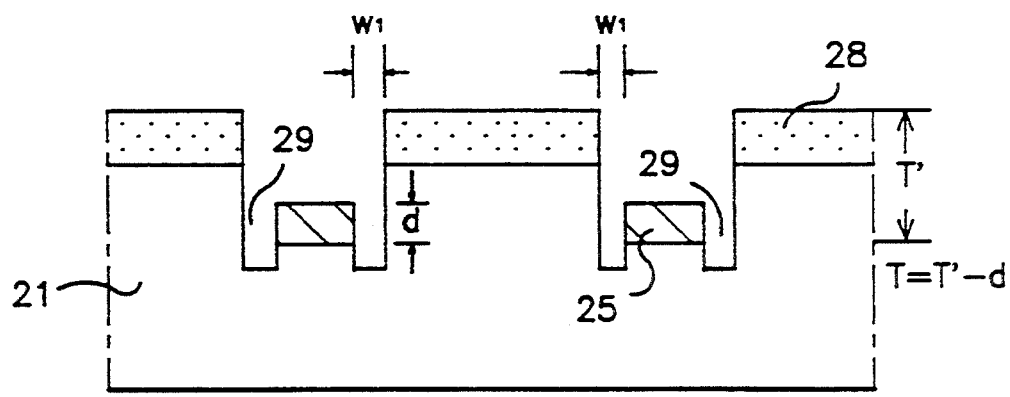

Referring to FIG. 5H, the phase shifting layer 28 and opaque layer 25 in FIG. 5G are served as the dry etch mask to form a groove in both sides of the trench 23.

The quartz substrate 21 is etched to the optimized thickness of T' for maximizing the light sensitivity as possible.

The thickness T for shifting the phase of the incident light is given as T'-d, where T' denotes etched depth of the quartz substrate 21, and d denotes a thickness of the phase shift layer 25.

Figure 6A:
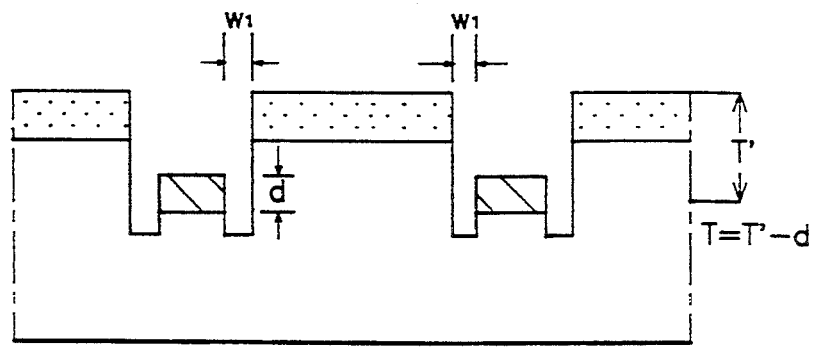
FIG. 6A to 6D graphically show the light intensity distribution of FIG. 5.
Figure 6B:
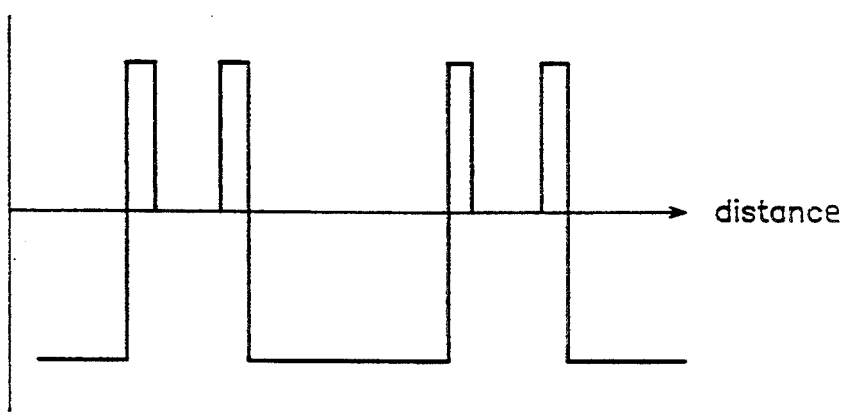
Figure 6C:
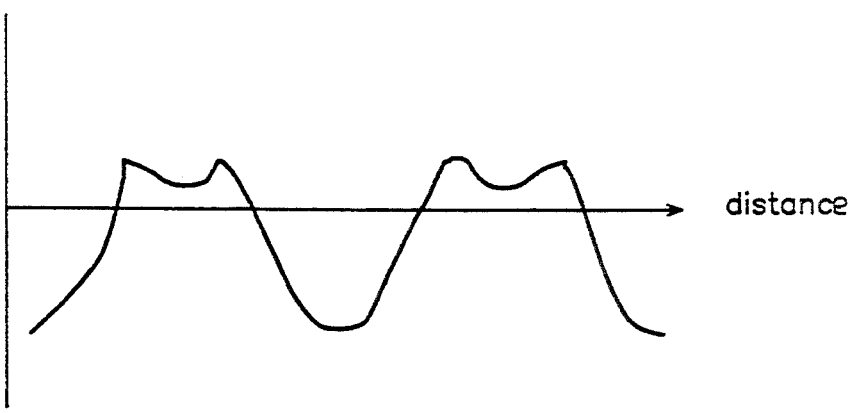
Figure 6D:
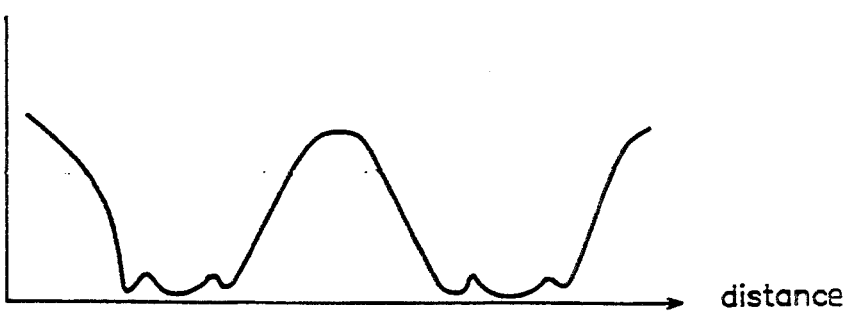

FIGS. 6A and 6D illustrate the light intensity distribution in the case of the use of the mask according to the second embodiment, it can be obtained the same effect as the mask of the first embodiment shown in FIG. 4.

As the third embodiment of this invention, the manufacturing steps of the mask are shown on FIG. 7A through 7I. And FIG. 8A to 8D represent the light intensity distribution associated with the manufactured mask.

The third embodiment is different from the second embodiment in that the manufacturing steps of the mask further comprises the step of removal of the phase shifting layer 29.

Figure 7A:
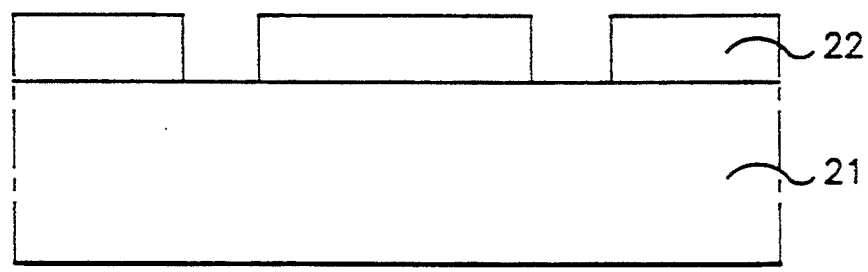
FIG. 7A to 7I are sectional views showing the process steps of a phase shift mask in accordance with third embodiment of this invention.
Figure 7B:
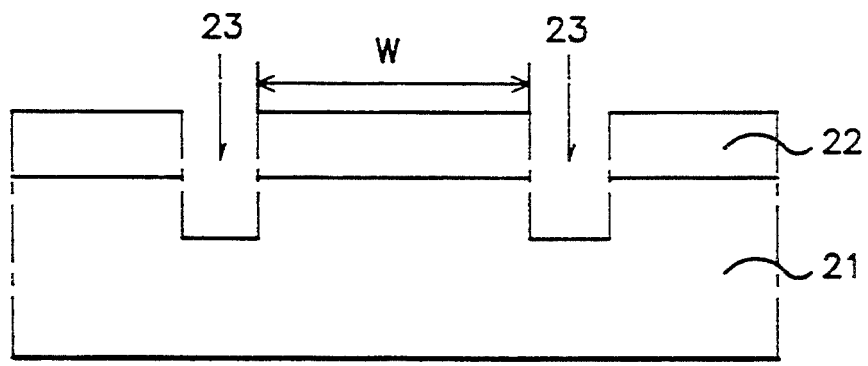
Figure 7C:
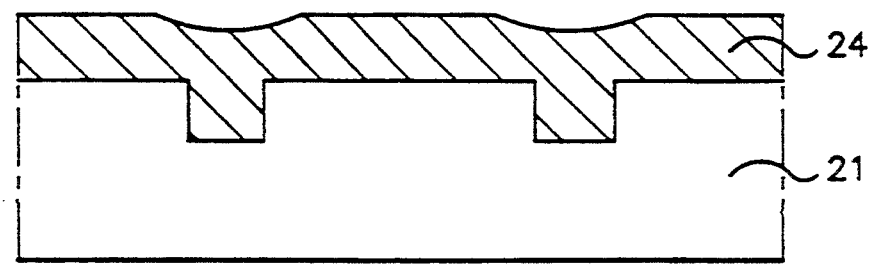
Figure 7D:
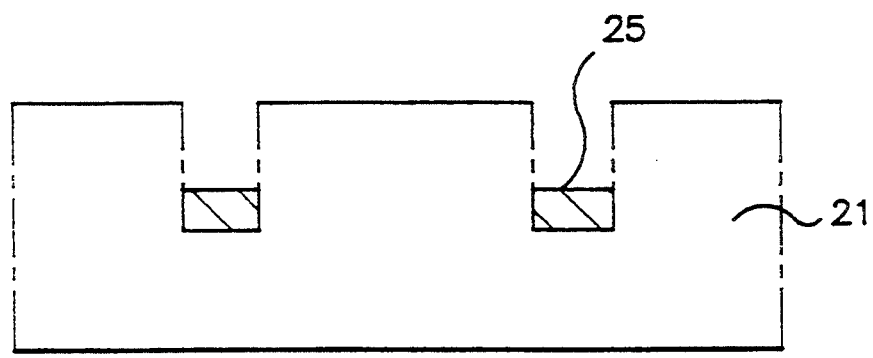
Figure 7E:
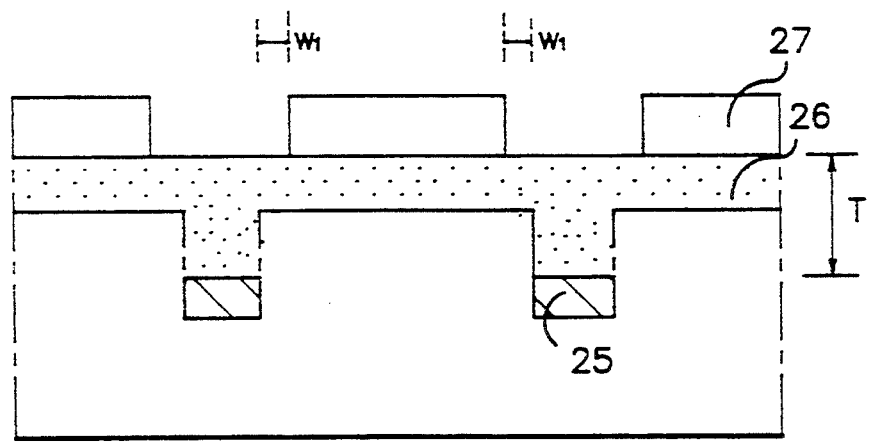
Figure 7F:
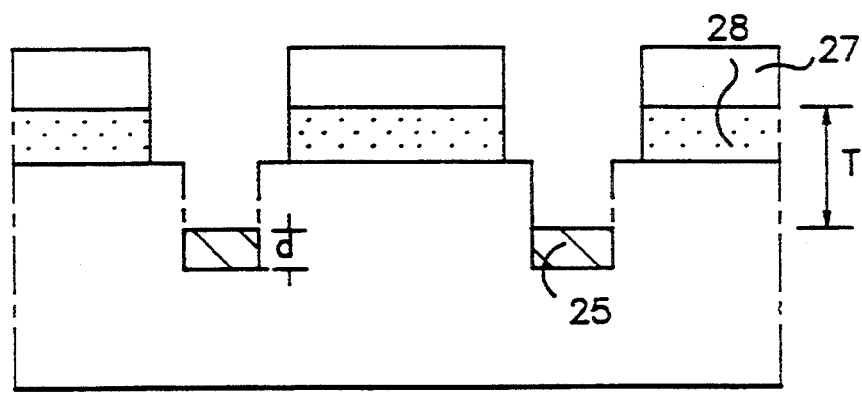
Figure 7G:
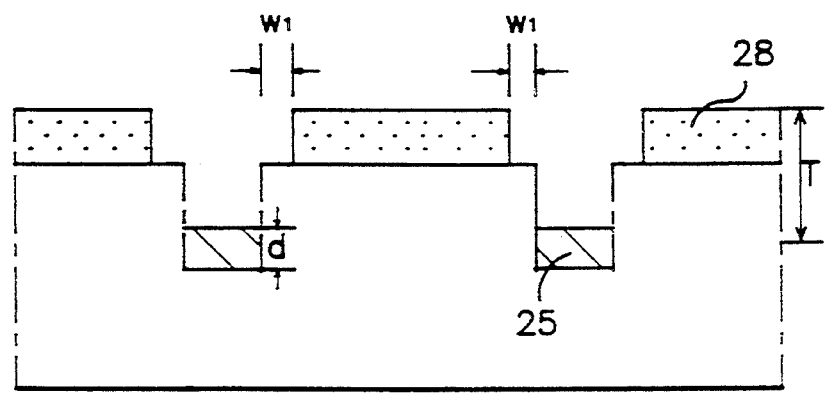
Figure 7H:
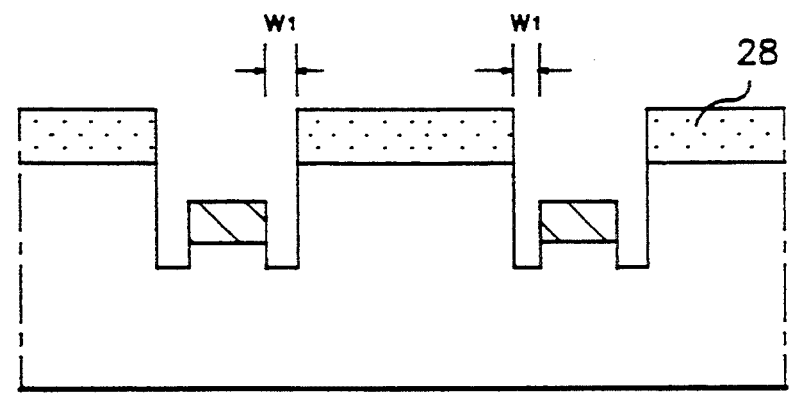
Figure 7I:
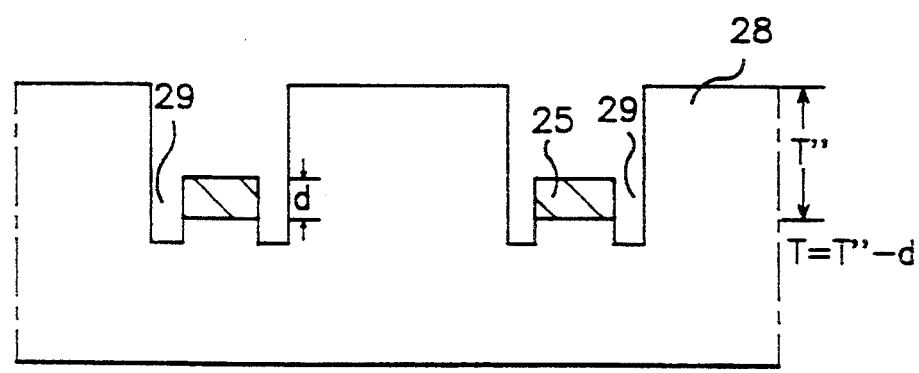
Figure 8A:
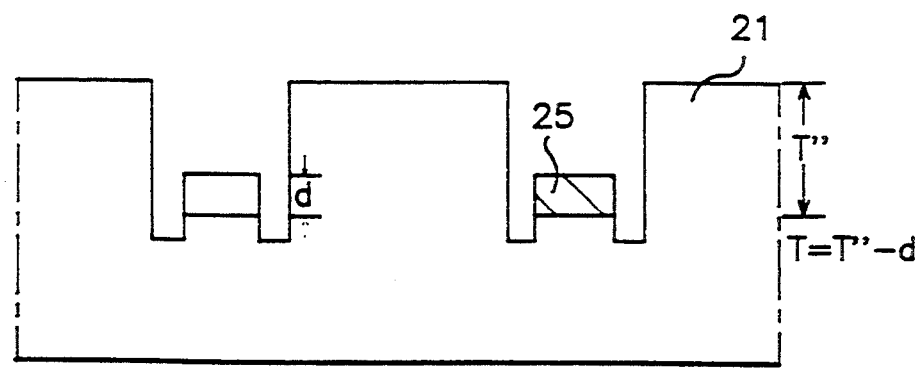
FIG. 8A to 8D graphically show the light intensity distribution of FIG. 7.
Figure 8B:
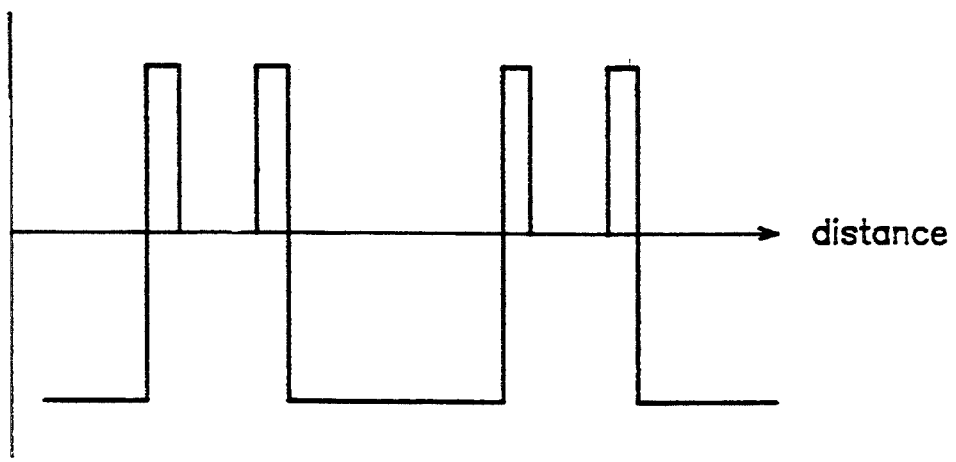
Figure 8C:
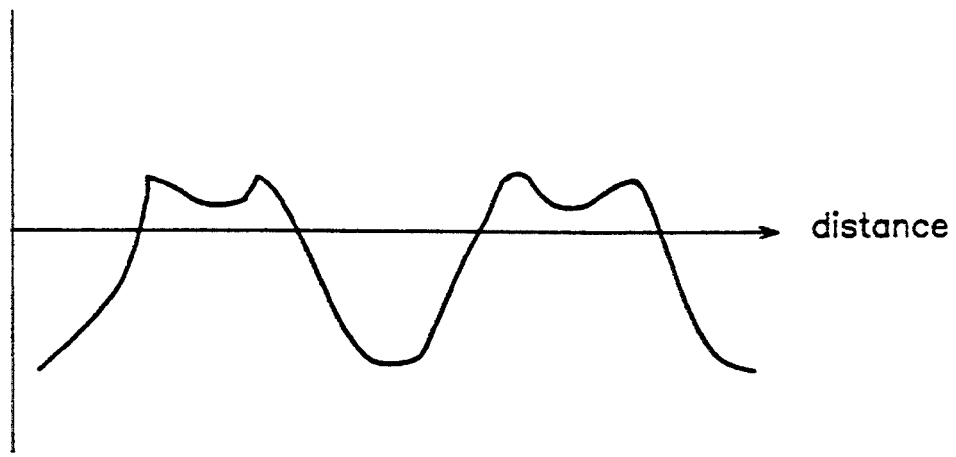
Figure 8D:
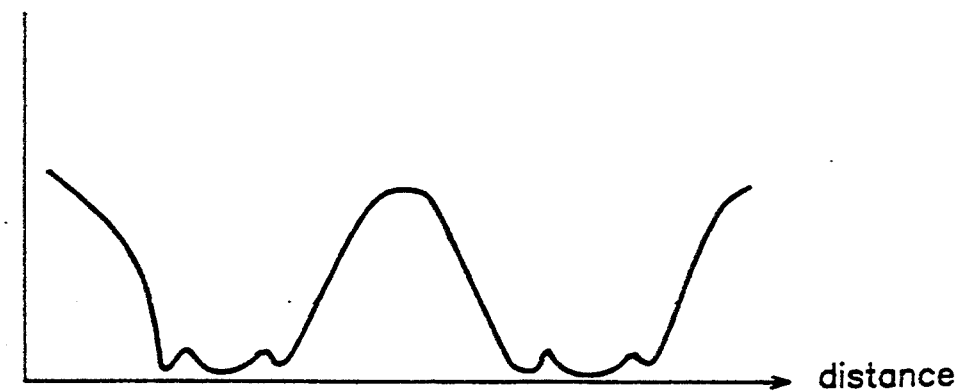

With the phase shifting layer 28 as the mask as shown in FIG. 7H, the revealed silicon substrate 21 is dry etched to form a groove 29 and then the phase shift mask is formed removing the phase shifting layer 28 as shown in FIG. 7I.

Figure 9A:
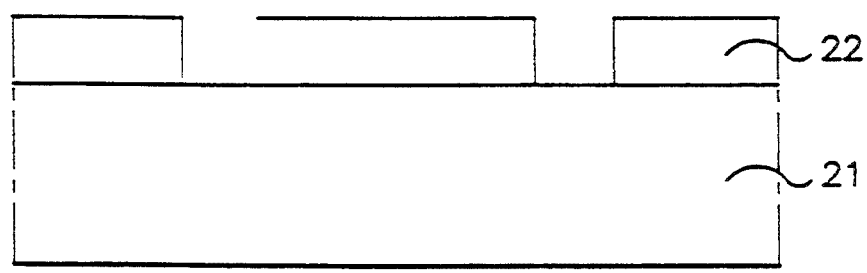
FIG. 9A to 9F are sectional views showing the process steps of a phase shift mask in accordance with fourth embodiment of this invention.
Figure 9B:
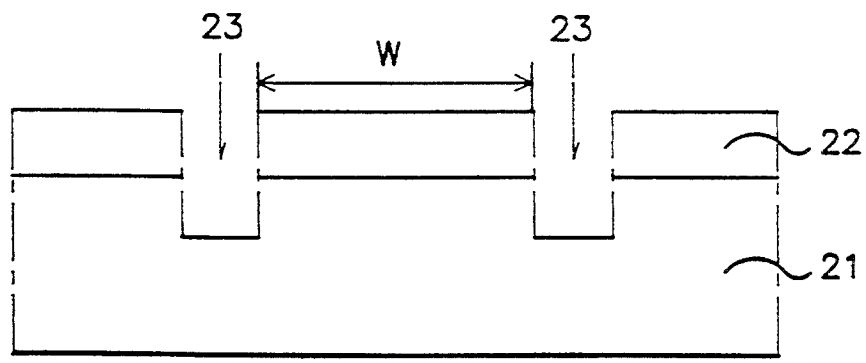
Figure 9C:
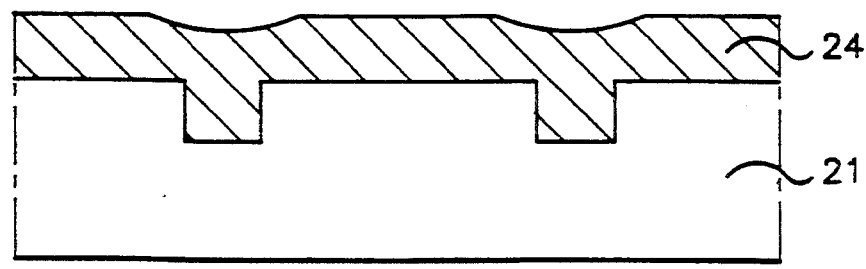
Figure 9D:
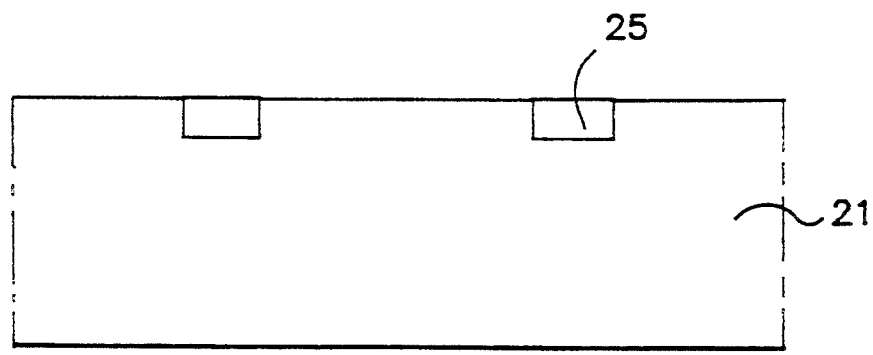
Figure 9E:
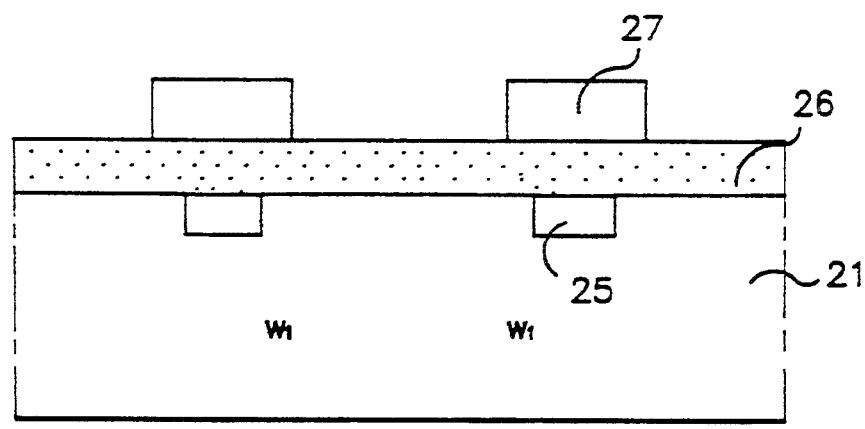
Figure 9F:
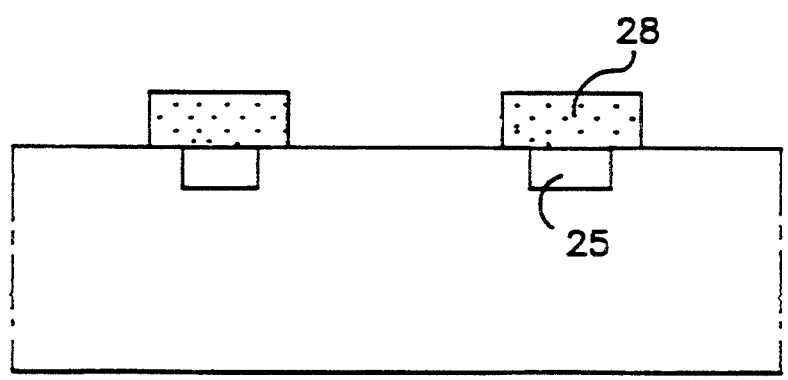
Figure 10A:
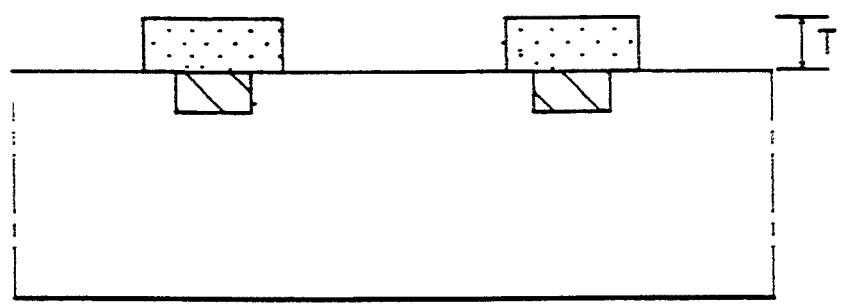
FIG. 10A to 10D graphically show the light intensity distribution of FIG. 9.
Figure 10B:
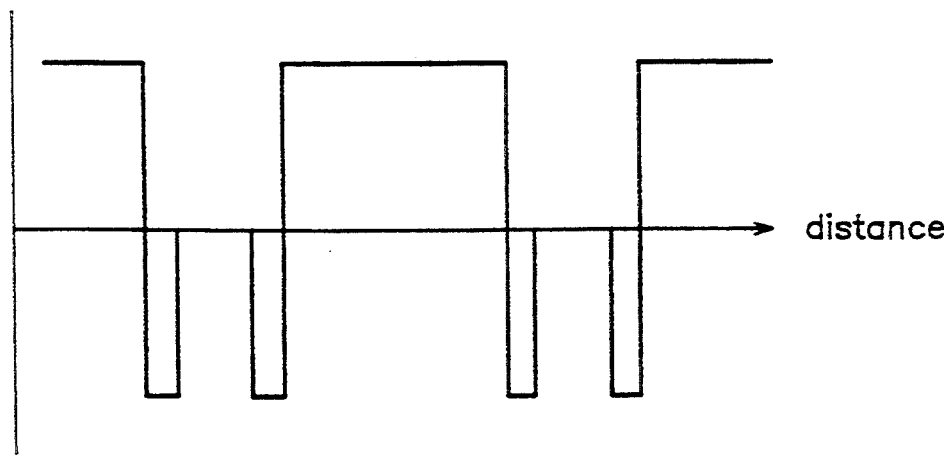
Figure 10C:
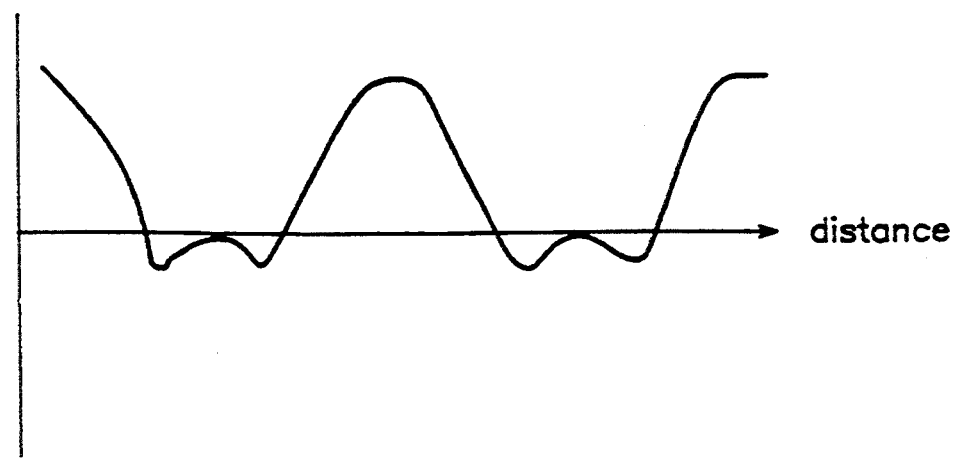
Figure 10D:
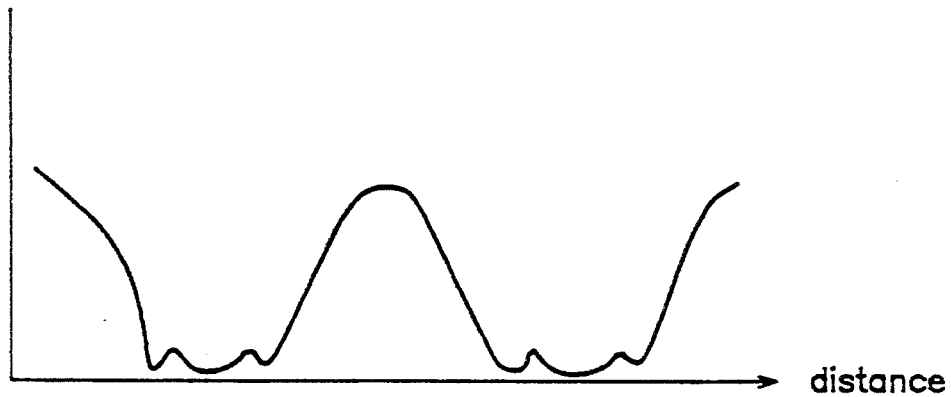

FIG. 9A and 9F are the process steps of the mask in accordance with the fourth embodiment. On the transparent quartz substrate 21 is coated the photoresist film 22 to form the photoresist pattern of width W through the well-known photolithographic process (FIG. 9A).

The patterned photoresist film 22 acts as the mask to form a trench 23 by etching the substrate 21 (FIG. 9B). Upon removal of the photoresist pattern 22, a layer of chrome 24 is deposited over the substrate 21 to fully fill the trench 23 (FIG. 9C).

The physical and chemical polishing step makes the opaque layer 25 as high as the quartz substrate, thereby maintaining the smoothed level throughout the whole surface for planarization (FIG. 9D).

Over the entire surface it is formed an oxide layer 26 on which a photoresist film is coated again. The coated photoresist film 27 is patterned to form a photoresist pattern by photolithography (FIG. 9E).

Upon removal of the photoresist layer 27 after the formation of the phase shifting layer, it is obtained the edge enhancement phase shifting mask of the full filled trench with the opaque layer.

While on the first to third embodiments the opaque layer 25 occupies some portion of the trench 25, the full filled opaque layer in the trench leaves to the flat plane throughout the surface of the substrate, according to the fourth embodiment.

FIG. 10A to 10D are graph showing the light intensity distribution according to the fourth embodiment of FIG. 9 and the same light intensity on the wafer is shown at the edge portions, although there is the phase difference of 180 degrees in comparison with the waveform of FIG. 4 in accordance with the first embodiment in which some portion in the trench is filled with the opaque layer 25.

FIG. 11A to 11G are the process steps of the phase shifting mask in accordance with the fifth embodiment of this invention and FIG. 12A to 12D graphically show the light intensity distribution according to the fifth embodiment of this invention.

Figure 11A:
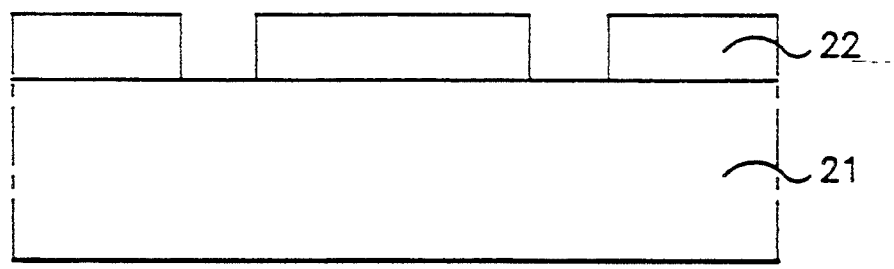
FIG. 11A to 11H are sectional views showing the process steps of a phase shift mask in accordance with fifth embodiment of this invention.
Figure 11B:
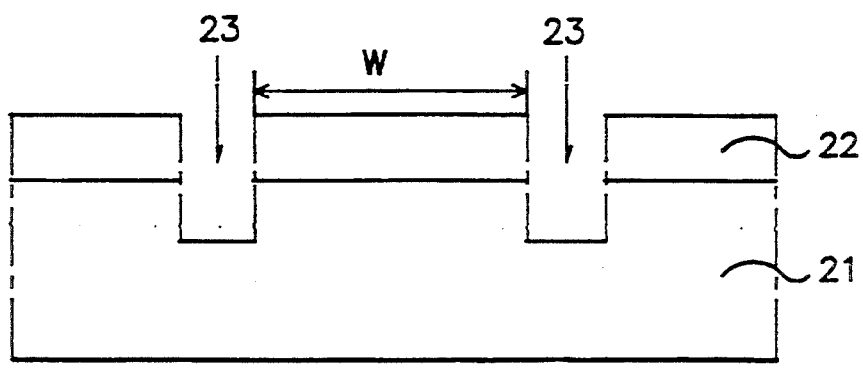
Figure 11C:
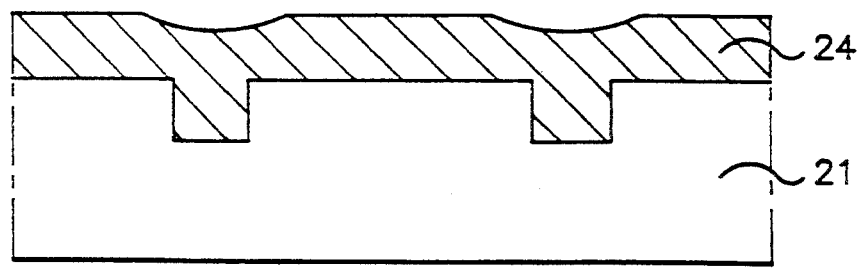
Figure 11D:
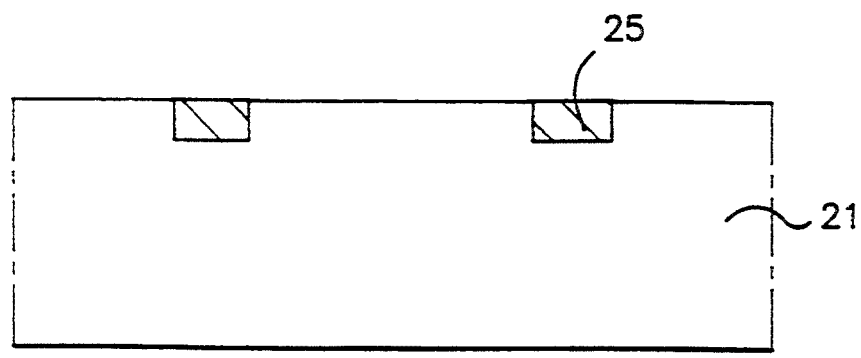
Figure 11E:
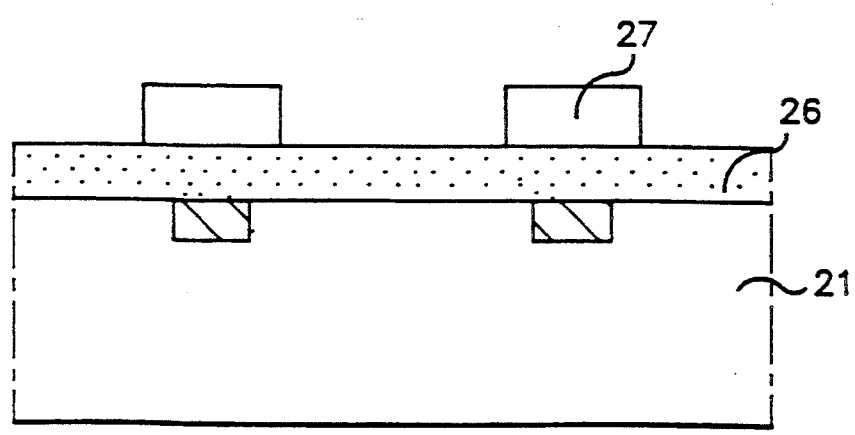
Figure 11F:
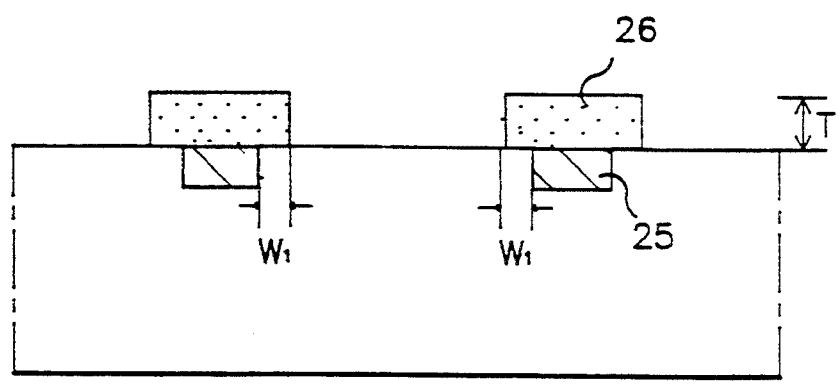
Figure 11G:
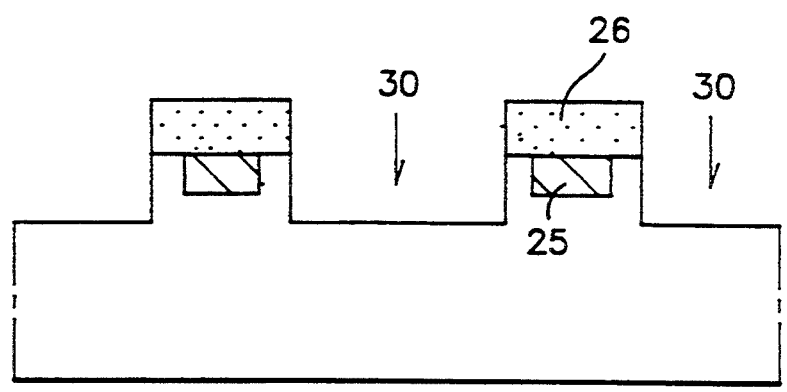
Figure 11H:
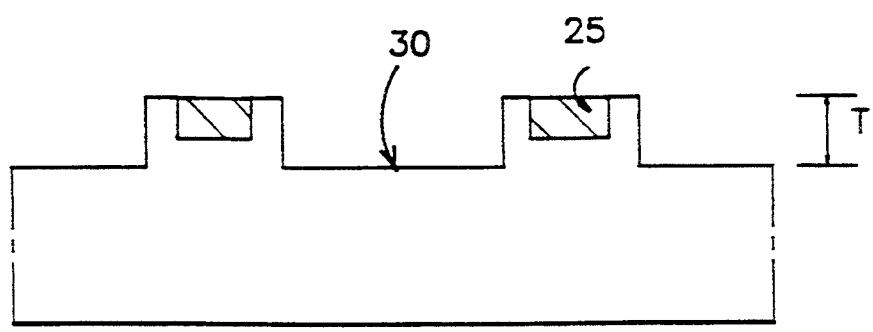
Figure 12A:
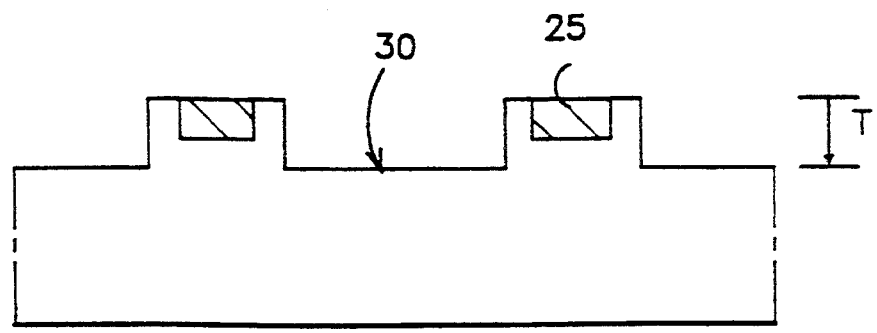
FIG. 12A to 12D graphically show the light intensity distribution of FIG. 11.
Figure 12B:
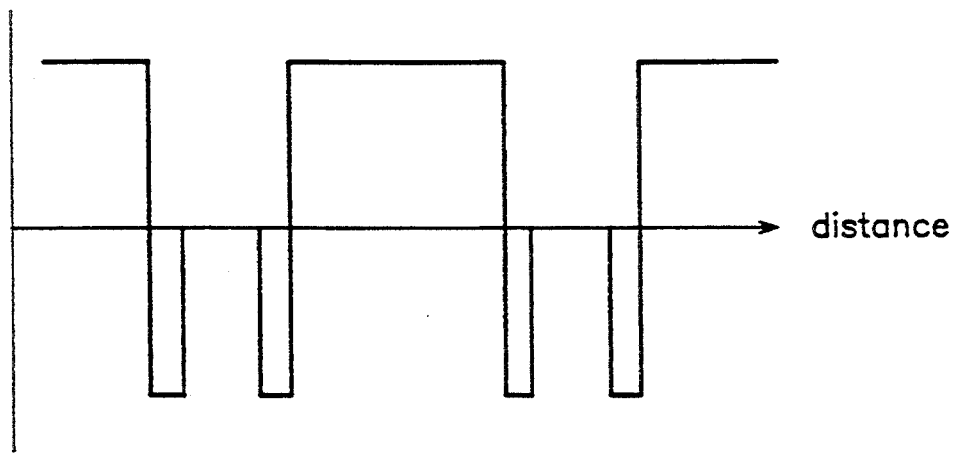
Figure 12C:
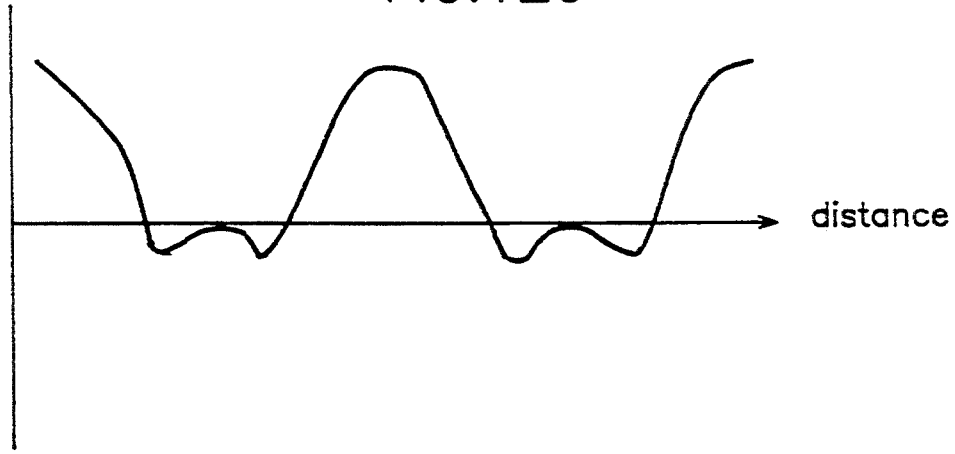
Figure 12D:
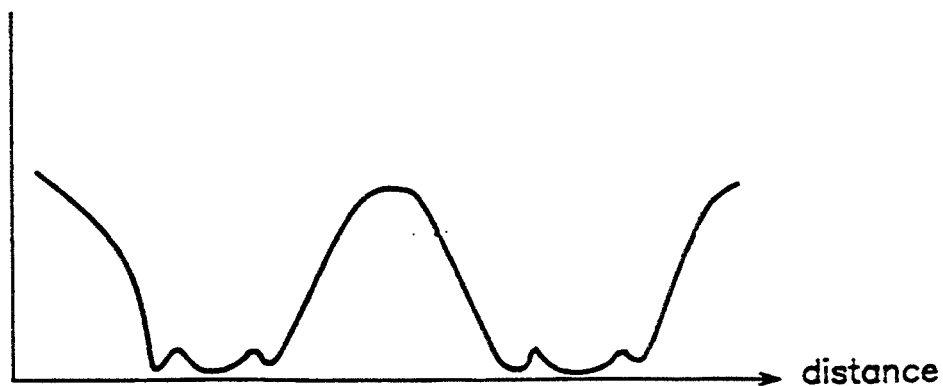

The fifth embodiment is characterized in that, as shown in FIG. 11G and 11H, the exposed substrate 21 is etched to form the recessed portion and then the phase shifting layer 28 used as the etch mask is removed.

The invention which is described as above exhibits the following advantages.

First, to form the recessed trench structure by filling the trench with the opaque shifting layer enables to readily cure the defected phase shifting mask and fabricate the phase shifting mask in comparison with the conventional edge enhancement mask.

Second, the vertically formed side wall configuration of the phase shifting layer and light shielding layer provides the optimized phase shifting effect at the patterned edge portion in passing the incident light.

Third, this invention facilitate to adjust the line width and thickness of the phase shifting layer around the light shielding layer.

What is claimed is:

1. A phase shifting mask comprising:
   a transparent substrate having at least one or more trenches spaced apart from each other by a predetermined distance;
   an opaque layer filling some portion of the trench; and
   a phase shifting layer formed on the substrate area between the trenches.

2. A phase shifting mask of claim 1 wherein the transparent substrate is made of quartz.

3. A phase shifting mask of claim 1, wherein the opaque layer is served as a light shielding layer.

4. A phase shifting mask of claim 3 wherein the opaque layer is made of either chrome or aluminum.

5. A phase shifting mask of claim 1, wherein the phase shifting layer comprises one of oxide layer, PMMA, SOG, or quartz.

6. A phase shifting mask of claim 1, wherein the width of the phase shifting layer is equal to or less than the width between the adjacent trenches.

7. A phase shifting mask of claim wherein the transparent substrate further comprises a groove formed in both sides of the trench.

8. A phase shifting mask of claim 7, wherein the groove has the width less by half distance of a factor than the distance between the trenches.

9. A phase shifting mask of claim 1, wherein the thickness of the opaque layer is more thin than the depth of the trench.

10. A phase shifting mask of claim 1, wherein the thickness T of the phase shifting layer is $\lambda/[2(n-1)]$, where denotes the wavelength of exposure light source and n denotes the index of refraction.

11. A method of manufacturing the phase shifting mask comprising the steps of:
    forming a first photoresist pattern by etching the coated photoresist film on a transparent substrate;
    forming at least one or more trenches by etching the transparent substrate masked with the patterned photoresist layer;
    forming a opaque layer occupying some portion of the trench through etch back process applying to a deposited metal layer on the whole surface of the substrate;
    depositing a phase shifting layer over the whole surface of the substrate;
    forming a second photoresist pattern over the phase shifting layer formed on non-etched substrate area; and
    forming a phase shifting layer on the surface of the non-etched transparent substrate and exposing a substrate area between the phase shifting layer and the opaque layer.

12. A method of claim 11, wherein the opaque layer is served as a light shielding layer.

13. A method of claim 11, wherein the metal layer is a layer of chrome or aluminum.

14. A method of claim 11, wherein the transparent substrate is made of the quartz.

15. A method of claim 11, wherein the phase shifting layer comprises one of oxide layer, PMMA, SOG, or quartz.

16. A method of claim 11, wherein the width of the phase shifting layer is equal to or less than that of the non-etched substrate area.

17. A method of claim 11, wherein the process step is further comprised which a groove in both sides of the trench is formed by etching the exposed substrate after the formation of the phase shifting layer.

18. A method of claim 17, wherein the groove is formed by dry etching the exposed substrate masked with the opaque layer and phase shifting layer.

19. A method of claim 17, wherein the exposed substrate is etched to the depth for 180 degrees shifts of the phase with respect to the phase shift of the phase shifting layer.

20. A phase shifting mask comprising:
a transparent substrate having at least one or more trenches spaced apart from each other by a predetermined distance and a groove formed in both sides of the trench; and
an opaque layer filled in some portion of the trench to form a recess.

21. A method of manufacturing the phase shifting mask comprising the steps of:
forming a first photoresist pattern by etching the coated photoresist film on a transparent substrate;
forming at least one or more trenches by etching the transparent substrate masked with the patterned photoresist layer;
forming a opaque layer occupying some portion of the trench through etch back process applying to a deposited metal layer on the whole surface of the substrate;
forming a phase shifting layer over the surface of the non-etched transparent substrate and exposing a substrate area between the phase shifting layer and the opaque layer;
forming a groove in both sides of the trench by etching the exposed substrate; and
removing the phase shifting layer and exposing the whole surface of the substrate.

22. A phase shifting mask comprising:
a transparent substrate having at least one or more trenches spaced apart from each other by a predetermined distance;
an opaque layer filled in the trench, leaving to the flat plane throughout the surface of the substrate; and
a phase shifting layer formed over the opaque layer.

23. A phase shifting mask of claim 22, wherein the width of the phase shifting layer is larger than that of the opaque layer.

24. A phase shifting mask of claim 22, wherein the substrate has the recessed portion between the phase shifting layers.

25. A phase shifting mask of claim 24, wherein the width of the recessed portion is equal to the distance between the phase shifting layers.

26. A method of manufacturing the phase shifting mask comprising the steps of:
forming a first photoresist pattern by etching the coated photoresist film on a transparent substrate;
forming at least one or more trenches by etching the transparent substrate masked with the patterned photoresist layer;
etching back a formed metal layer on the whole surface of the substrate and forming a opaque layer in the trench, leaving to the flat plane throughout the surface of the substrate; and
forming a phase shifting layer over the opaque layer and exposing a non-etched substrate between the phase shifting layers.

27. A method of claim 26, wherein the process step of forming the opaque layer comprises the physical and chemical polishing procedure.

28. A method of claim 26, wherein the process step is further comprised which the recessed portion is formed on the substrate between the phase shifting layers by the forming of the phase shifting layer and subsequent etching of the exposed substrate.

* * * * *